(12) United States Patent
Zohrabyan et al.

(10) Patent No.: US 12,354,962 B2
(45) Date of Patent: Jul. 8, 2025

(54) STANDARD CELL LAYOUT FOR BETTER ROUTABILITY

(71) Applicant: Taiwan Semiconductor Manufacturing Company Limited, Hsinchu (TW)

(72) Inventors: Tigran Zohrabyan, Ottawa (CA); YangJae Shin, Ottawa (CA); Konstantin Bregman, Thornhill (CA); Rolando A. Villanueva, Ottawa (CA); Yunle Sun, Ottawa (CA)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 18/515,657

(22) Filed: Nov. 21, 2023

(65) Prior Publication Data

US 2024/0088046 A1    Mar. 14, 2024

Related U.S. Application Data

(60) Continuation of application No. 17/734,156, filed on May 2, 2022, now Pat. No. 11,862,568, which is a
(Continued)

(51) Int. Cl.
*H01L 23/535* (2006.01)
*G06F 30/394* (2020.01)
(Continued)

(52) U.S. Cl.
CPC .......... *H01L 23/535* (2013.01); *G06F 30/394* (2020.01); *H01L 21/4846* (2013.01); *H01L 21/486* (2013.01); *H01L 21/76895* (2013.01); *H01L 23/498* (2013.01); *H01L 23/49827* (2013.01); *H10D 84/907* (2025.01); *H10D 89/10* (2025.01); *H10D 84/975* (2025.01)

(58) Field of Classification Search
None
See application file for complete search history.

(56) References Cited

U.S. PATENT DOCUMENTS 6,174,803 B1    1/2001  Harvey
7,326,595 B2 *  2/2008  Kuroki ............. H01L 27/11898
                                                  257/E21.526
(Continued)

*Primary Examiner* — Hung K Vu
(74) *Attorney, Agent, or Firm* — Jones Day

(57) ABSTRACT

A method of fabricating an integrated circuit is disclosed. The method comprises defining a multi-layer semiconductor device structure on a substrate using standard cells, defining an input port on the M0OD or PO layer of the semiconductor device structure and an output port on the M0OD layer, and defining a metal-1 layer over the M0OD and PO layers, the metal-1 layer having a first set of conduction paths and a second set of conduction paths. The method further comprises defining a metal-2 layer over the metal-1 layer and configuring the first set of metal-1 conduction paths and the metal-2 conduction paths to interconnect circuit components in different cells, wherein inter cell connections in the semiconductor device structure are made using the first set of metal-1 conduction paths or a combination of the first set of metal-1 and the metal-2 conduction paths.

20 Claims, 7 Drawing Sheets

Related U.S. Application Data division of application No. 16/205,292, filed on Nov. 30, 2018, now Pat. No. 11,322,443, which is a continuation of application No. 15/251,433, filed on Aug. 30, 2016, now Pat. No. 10,128,189.

(51) Int. Cl.
*H01L 21/48* (2006.01)
*H01L 21/768* (2006.01)
*H01L 23/498* (2006.01)
*H10D 84/90* (2025.01)
*H10D 89/10* (2025.01)

(56) References Cited

U.S. PATENT DOCUMENTS 8,063,415 B2 * 11/2011 Tsuda ................. H01L 27/0207
257/773
10,128,189 B2 11/2018 Zohrabyan et al.
11,862,568 B2 * 1/2024 Zohrabyan .......... H01L 27/0207

* cited by examiner

STANDARD CELL LAYOUT FOR BETTER ROUTABILITY

CROSS-REFERENCE TO RELATED APPLICATIONS

This application is a continuation of U.S. patent application Ser. No. 17/734,156, filed May 2, 2022, which is a divisional of U.S. patent application Ser. No. 16/205,292, filed Nov. 30, 2018, which is a continuation of U.S. application Ser. No. 15/251,433, filed Aug. 30, 2016, entitled "Standard Cell Layout For Better Routability," the contents of each of which are incorporated herein by reference in their entirety.

BACKGROUND

The technology described in this patent document relates generally to semiconductor fabrication and more particularly to the metallization process in semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Improvements to the metallization process in semiconductor devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
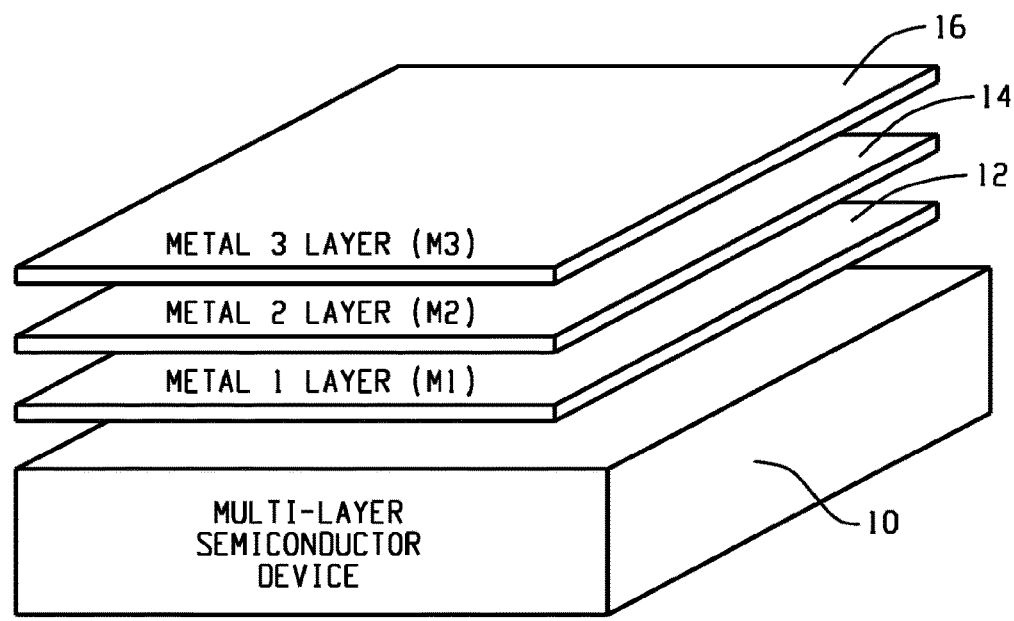
FIG. 1 is an exploded block diagram of a portion of an example integrated circuit (IC) during fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Depicted in FIG. 1 is an exploded block diagram of a portion of an example integrated circuit (IC) during fabrication. The example integrated circuit includes one or more multi-layer semiconductor device structure(s) 10 and a plurality of metal layers 12, 14, 16 sequentially formed above the multi-layer semiconductor device structure 10. In this example, only three metal layers (metal 1/2/3) are shown. But, the example integrated circuit may include additional upper metal layers such as metal 4/5/6/7/8/9/10/11/12/13/AP or others.

The multi-layer semiconductor device structure 10 comprises one or more circuits and the one or more circuits may be derived from standard cell designs. Standard cell designs may include a group of transistor and interconnect structures that provide a Boolean logic function (e.g., AND, OR, XOR, XNOR, or inverters) or a storage function (e.g., flip flop or latch). The multiple layers in the multi-layer device structure includes base layers, which correspond to the different structures of the transistor devices.

The metal layers 12, 14, 16 are interconnect wiring layers, which join together the terminals of the transistor formations. The interconnect wiring layers are numbered and have specific via layers representing specific connections between each sequential layer. In the example shown, the interconnect wiring layers include a metal-1 layer 12 formed above the multi-layer semiconductor device structure 10, a metal-2 layer 14 formed above the metal-1 layer, and a metal-3 layer 16 formed above the metal-2 layer. The metal layers include conduction paths that are used to interconnect circuits, transistors, and standard cell designs in the multi-layer semiconductor device structure. The via layers include a via0 (V0) layer (not shown) for joining a terminal of the transistor formation with a metal-1 conduction path, a via1 (V1) layer (not shown) for joining a metal-1 conduction path with a metal-2 conduction path, and a via2 (V2) layer (not shown) for joining a metal-2 conduction path with a metal-3 conduction path.

An example multi-layer semiconductor device structure may include one or more diffusion (OD) layers which may be designated as OD1, OD2, etc. A layer of metal commonly referred to as metal-0 ("metal zero" or M0) may be formed above the OD layer, often in the form of metal-0 oxide diffusions (M0OD). There may be multiple metal oxide diffusion layers over multiple OD layers (M0OD1, M0OD2, etc.) and/or multiple metal oxide diffusion layers (M0OD1, M0OD2) over a single OD layer. In some embodiments, an M0OD1 layer may be used as an OD contact layer in the source-drain regions of a transistor.

Figure 2:
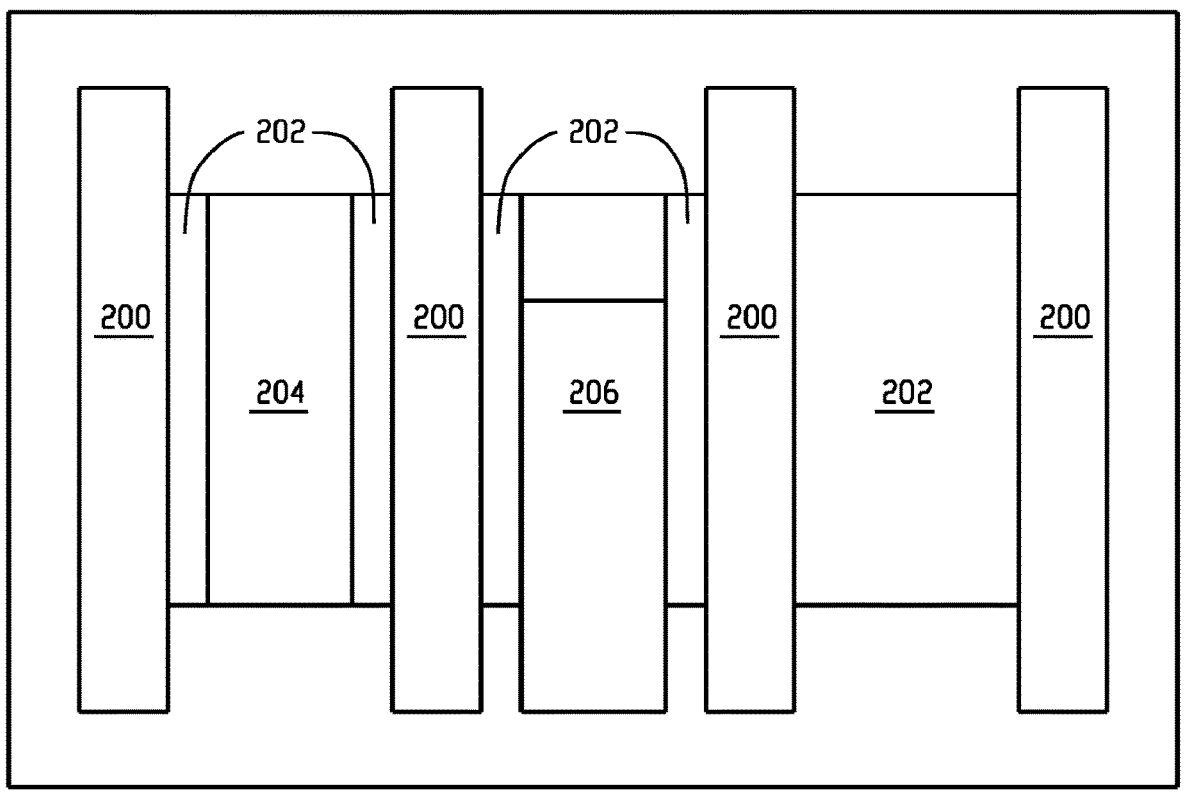
FIG. 2 is a top view illustrating an example configuration of the upper layers of an example semiconductor device structure, in accordance with some embodiments.

Depicted in FIG. 2 is a top view illustrating an example configuration of the upper layers of an example semiconductor device structure. The upper layers of the example semiconductor structure may include a polysilicon (PO) layer 200, an OD layer 202, an M0OD 1 layer 204, and an M0OD2 layer 206.

Figure 3:
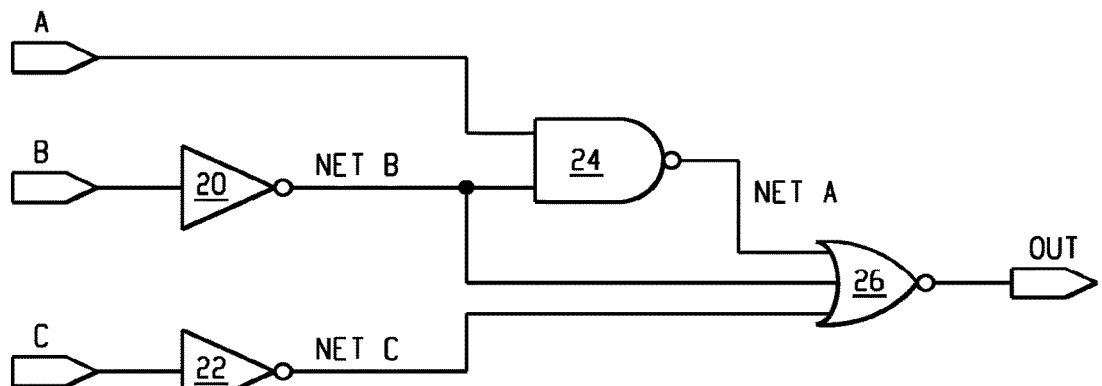
FIG. 3 is a schematic diagram of an example circuit that may be fabricated in a semiconductor device structure, in accordance with some embodiments.

Depicted in FIG. 3 is a schematic diagram of an example circuit that may be fabricated in the semiconductor device structure. The example circuit includes three input ports, input port A, input port B and input port C. The example circuit further includes a first inverter 20 with its input connected to input port B and a second inverter 22 with its input connected to input port C. The example circuit includes a two-input NAND gate 24 with a first input connected to input port A and a second input connected to the output (Net B) of the first inverter 20. The example circuit further includes a three input NOR gate 26 with a first input connected to the output (Net A) of NAND gate 24, a second input connected to Net B, and a third input connected to the output (Net C) of inverter 22. The output of the NAND gate 26 is connected to the output terminal (Out). Each of first inverter 20, second inverter 22, NOR gate 24, and NAND gate 26 may be implemented using standard cell designs.

Interconnect wiring layers and vias may be used to interconnect the transistors within a cell that make up the standard cell logic device as well as interconnecting transistors in different cells to provide inter-cell connections to complete the depicted circuit. The connections made within a cell are referred to herein as intra cell connections and the connections made between transistors in different cells are referred to herein as inter cell connections. Also, interconnect wiring layers and vias may be used to provide connection points for the input ports A, B, C and the output port (OUT).

Figure 4:
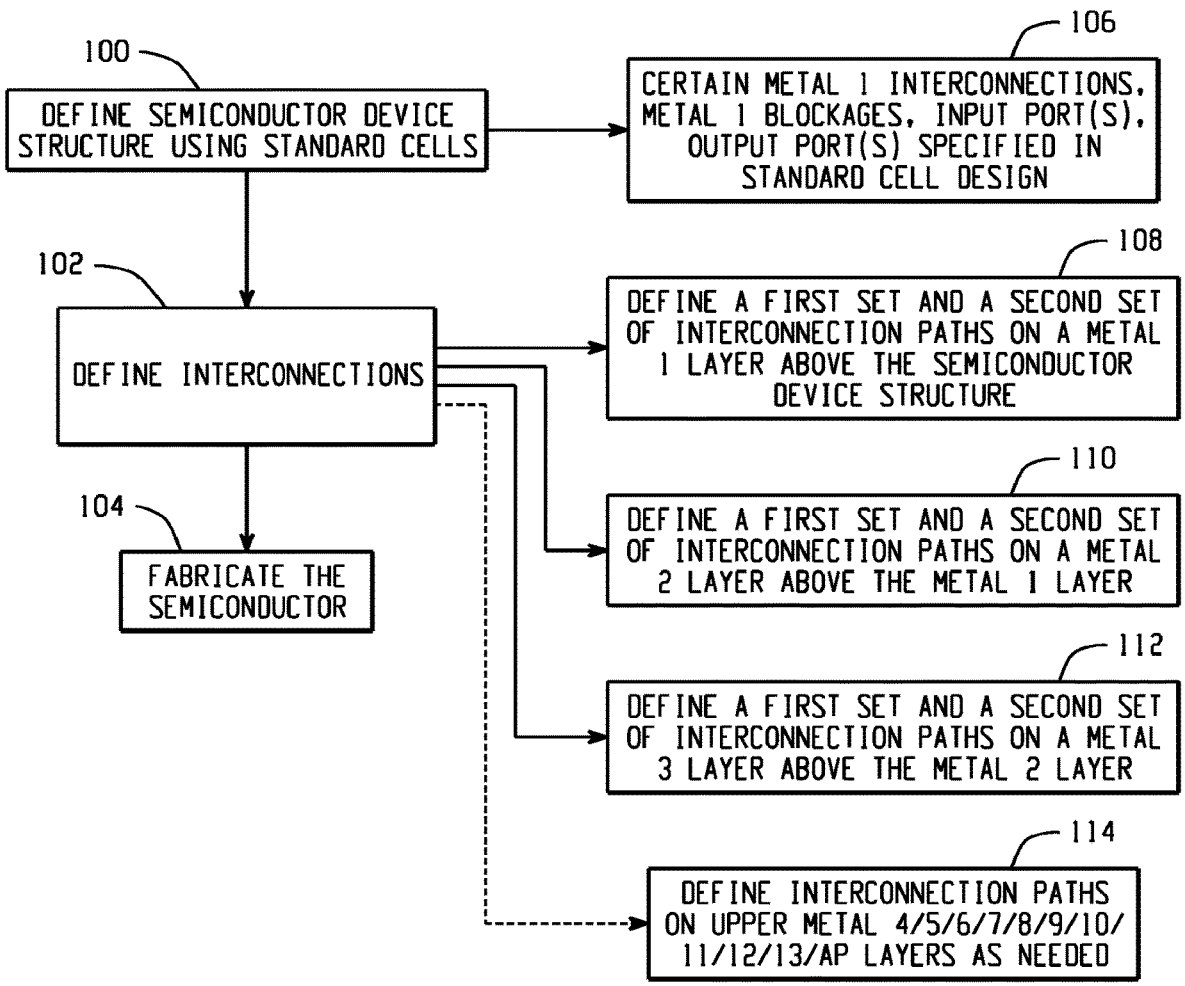
FIG. 4 is a flow chart depicting an example method of fabricating a semiconductor device structure, in accordance with some embodiments.

FIG. 4 is a flow chart depicting an example method of fabricating a semiconductor device structure such as one embodying the circuit depicted in FIG. 3. The example method comprises defining the semiconductor device structure using standard cells (operation 100) and defining the interconnections (operation 102). The method further includes fabricating the semiconductor structure so defined (operation 104). The standard cell designs used in defining the semiconductor structure may specify certain interconnections using a first interconnect layer (e.g., a metal-1 layer). The standard cell designs may specify certain intra cell connections, blockages, input port(s), and output ports using the metal-1 layer (operation 106).

Defining interconnections may involve defining interconnection paths on the metal-1 layer (operation 108), defining interconnection paths on a metal-2 layer above the metal-1 layer (operation 110), defining interconnection paths on a metal-3 layer above the metal-2 layer (operation 112), and defining interconnection paths on any upper metal-3/4/5/6/7/8/9/10/11/12/13/AP layers. Each metal layer may include a first and second set of interconnection paths with specific rules on which type of interconnection path, e.g., intra cell or inter cell, can be made with the respective set of interconnection paths. For example, a first set of interconnection paths could be assigned to making inter cell connections and a second set of interconnection paths could be assigned to making intra cell connections.

In some embodiments, standard cells can use up to 6 horizontal direction metal-1 conduction paths. This can have a limiting effect on the routing because metal-1 is not bendable. To perform routing between standard cells, routing may be performed using upper level metal layers. Using upper level metal layers for routing, however, may result in a decreased number of standard cells that may be placed in an area on an integrated circuit because greater space between the standard cells may be needed.

Figure 5:
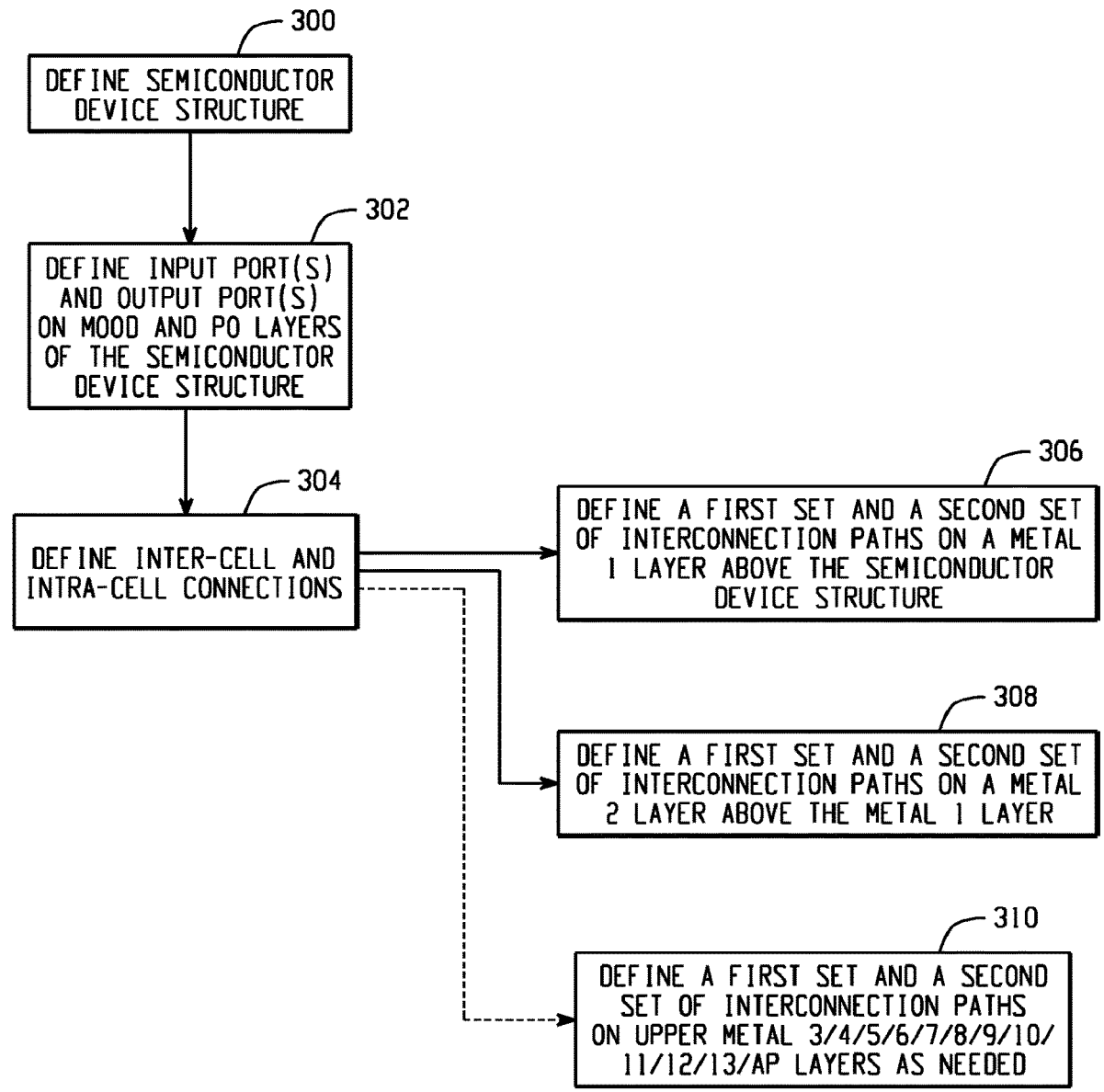
FIG. 5 is a flow chart depicting another example method of fabricating a semiconductor device structure, in accordance with some embodiments.

FIG. 5 is a flow chart depicting another example method of fabricating a semiconductor device structure such as one embodying the circuit depicted in FIG. 3. In this example method, metal-1 usage for inter cell routing is increased and upper level metal usage (e.g., metal-2, metal-3 and/or other upper metal level usage) is decreased. Because of increased metal-1 usage and decreased upper level metal usage, the example semiconductor device can have more digital blocks, IR drop can be reduced and routing can be made more flexible. This example method comprises defining a semiconductor device structure (operation 300), defining input port(s) on M0OD and PO layers of the semiconductor device structure and output port(s) on M0OD layers (operation 302), and defining inter cell and intra cell connections (operation 304) in a way that maximizes the use of the metal-1 layer for interconnections and minimizes the use of upper metal layers for interconnections. In this example method, defining inter cell and intra cell connections (operation 304) may involve defining a first set and a second set of interconnection paths (e.g., metal-1 mask A and metal-1 mask B) on the metal-1 layer above the semiconductor structure (operation 306) and defining a first set and a second set of interconnection paths (e.g., metal-2 mask A and metal-2 mask B) on the metal-2 layer above the metal-1 layer (operation 308) wherein the metal-2 conduction paths are in a direction perpendicular to the direction of the metal-1 conduction paths. First sets and second sets of interconnection paths (e.g., metal-3/4/5/6/7/8/9/10/11/12/13/AP mask A and metal-3/4/5/6/7/8/9/10/11/12/13/AP mask B) may be defined on the upper metal layers as needed (operation 310).

Figure 6:
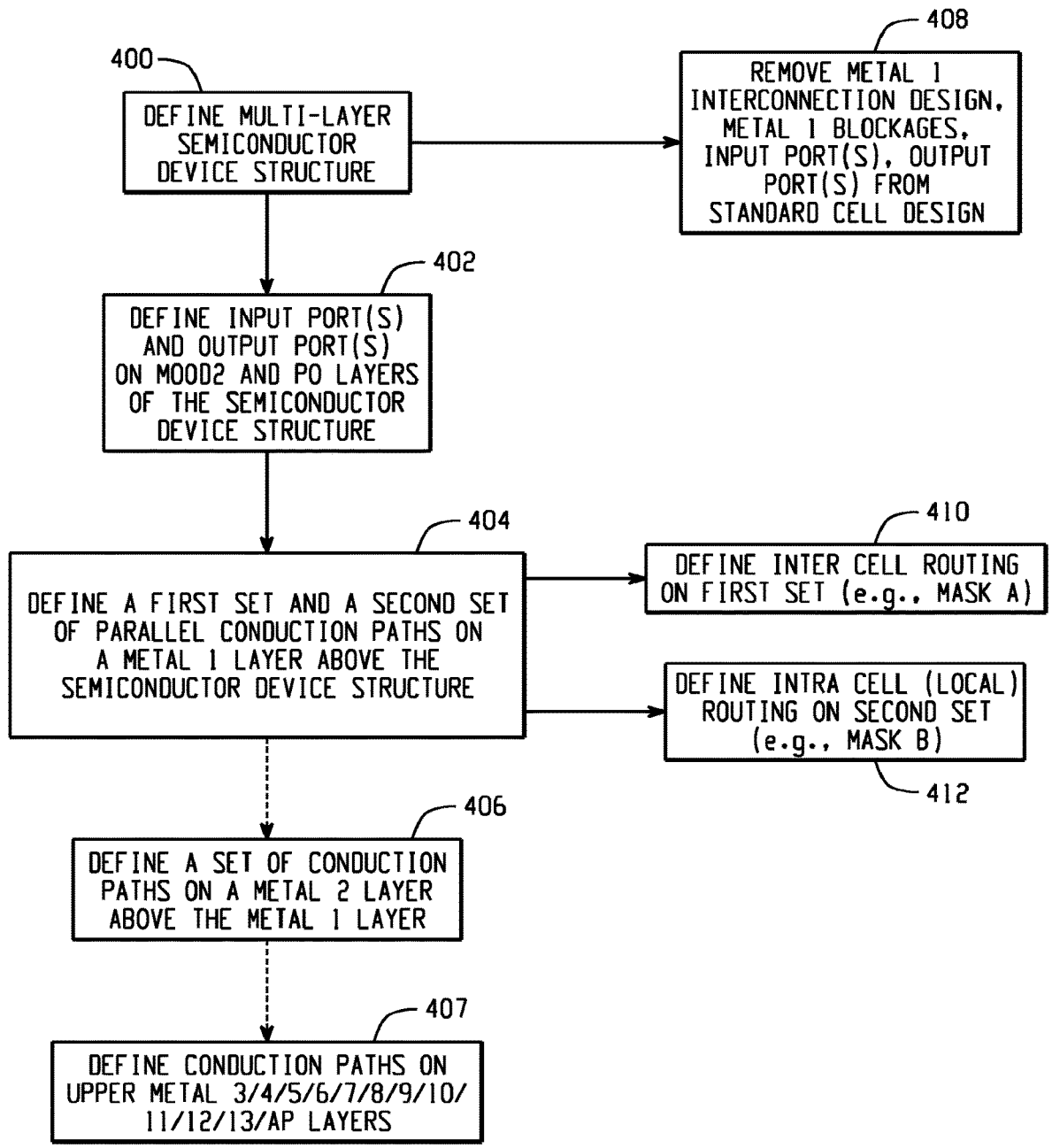
FIG. 6 is a flow chart depicting another example method of fabricating a semiconductor device structure, in accordance with some embodiments.

FIG. 6 is a flow chart depicting another example method of fabricating a semiconductor device structure such as one embodying the circuit depicted in FIG. 3. In this example method, metal-1 usage for inter cell routing is increased and upper level metal usage (e.g., metal-2, metal-3 and/or other upper metal level usage) is decreased. Because of increased metal-1 usage and decreased upper level metal usage, the example semiconductor device can have more digital blocks, IR drop can be reduced and routing can be made more flexible. IR drop increases when paths in upper levels are used for interconnections because paths become longer. IR drop also increases because vias are used to connect metal paths in different layers. The resistivity of the vias are typically much higher than the resistivity of the metal paths.

This example method comprises defining a multi-layer semiconductor device structure comprising a plurality of standard cells arranged on a substrate using a fabrication technology having an M0OD layer and a PO layer (operation 400), defining input port(s) on the M0OD and/or PO layers of the semiconductor device structure and output port(s) on the M0OD layers (operation 402), defining a first set and a second set of interconnection paths (e.g., metal-1 mask A and metal-1 mask B) on the metal-1 layer above the semiconductor structure (operation 404) and defining a first set and a second set of interconnection paths (e.g., metal-2 mask A and metal-2 mask B) on the metal-2 layer above the metal-1 layer (operation 406) as necessary, wherein the metal-2 conduction paths are in a direction perpendicular to the direction of the metal-1 conduction paths. Interconnection paths may be defined on the upper metal layers (e.g., metal 3/4/5/6/7/8/9/10/11/12/13/AP) as needed (operation 407). In this example, defining a multi-layer semiconductor device structure comprises removing the metal-1 interconnection design, metal-1 blockages, input port(s), and output port(s) from the standard cell design. Also in this example, defining a first set and a second set of interconnection paths on the metal-1 layer comprises defining inter cell routing on the first set of interconnection paths (e.g., MaskA) wherein at least one metal-1 conduction path in the first set of conduction paths extends across multiple cells (operation 410) and defining the intra cell routing on the second set of interconnection paths (e.g., MaskB) (operation 412). The first set of metal-1 conduction paths and the metal-2 conduction paths are configured to interconnect circuit components in different cells.

Figure 7:
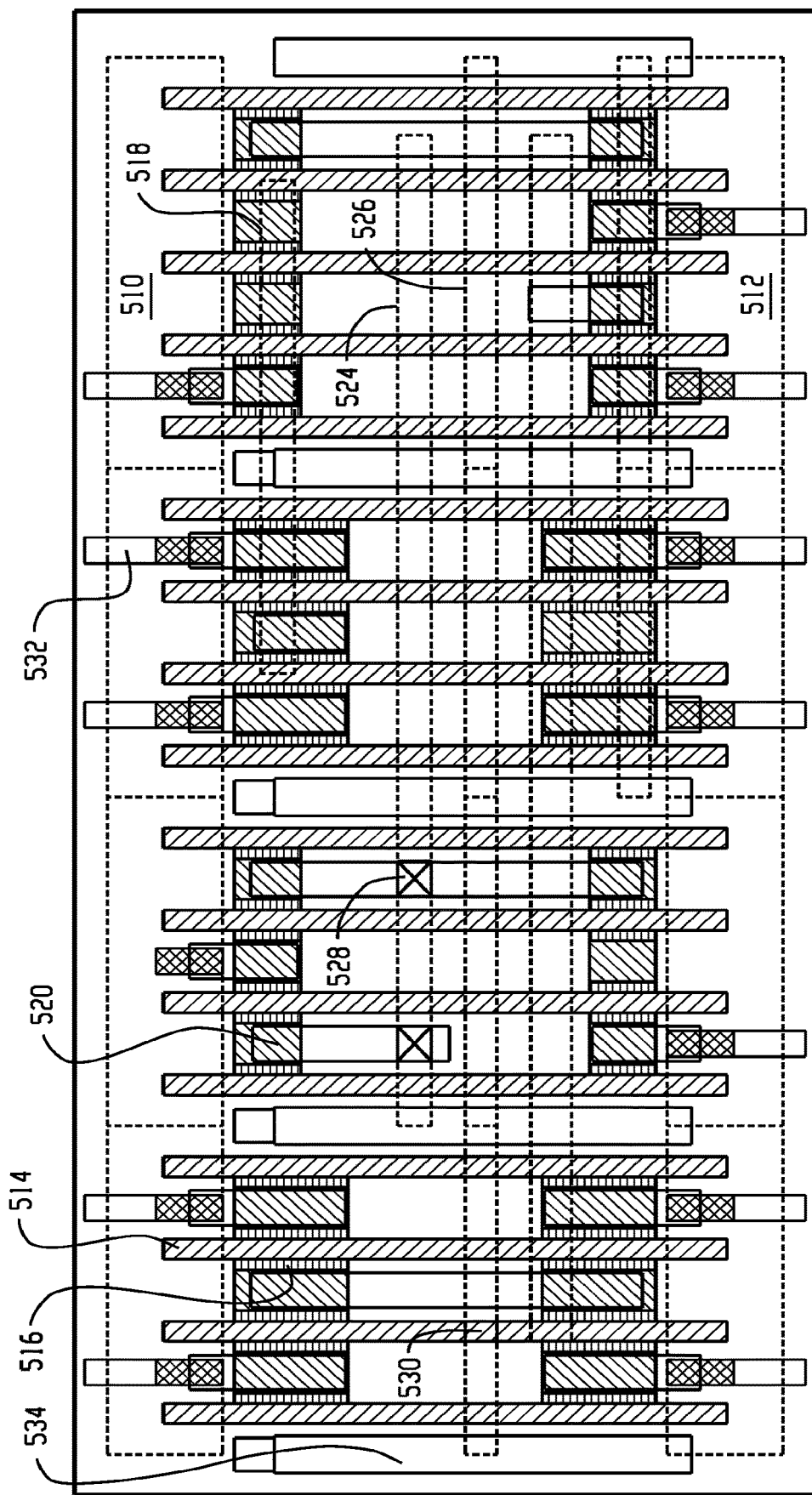
FIG. 7 is a layout diagram illustrating an example layout of the metal-1 layer for a semiconductor structure, in accordance with some embodiments.

Depicted in FIG. 7 is a top view illustrating an example layout of the upper layers of the semiconductor structure of the circuit of FIG. 3 and the associated metal-1 layer fabricated in accordance with the method specified in FIG. 5 or 6. Illustrated in the example layout are a VDD power rail 510, a VSS power rail 512, a PO layer 514, an OD layer 516, a M0OD1 layer 518, a M0OD2 layer 520, metal-1 mask A conduction paths 524, metal-1 mask B conduction paths 526, a V0_MD via layer 528, a V0_MG via layer 530, RVIA 532, and CMI element 534. The layout shows metal-1 mask A conduction paths 524 spanning across multiple cells, which allows inter cell connections without using upper metal layers. Because the metal-1 interconnection design, metal-1 blockages, input port(s), and output port(s) are removed from the standard cell design, the metal-1 mask A conduction paths 524 can span across multiple cells, which allows inter cell connections without using upper metal layers.

Figure 8:
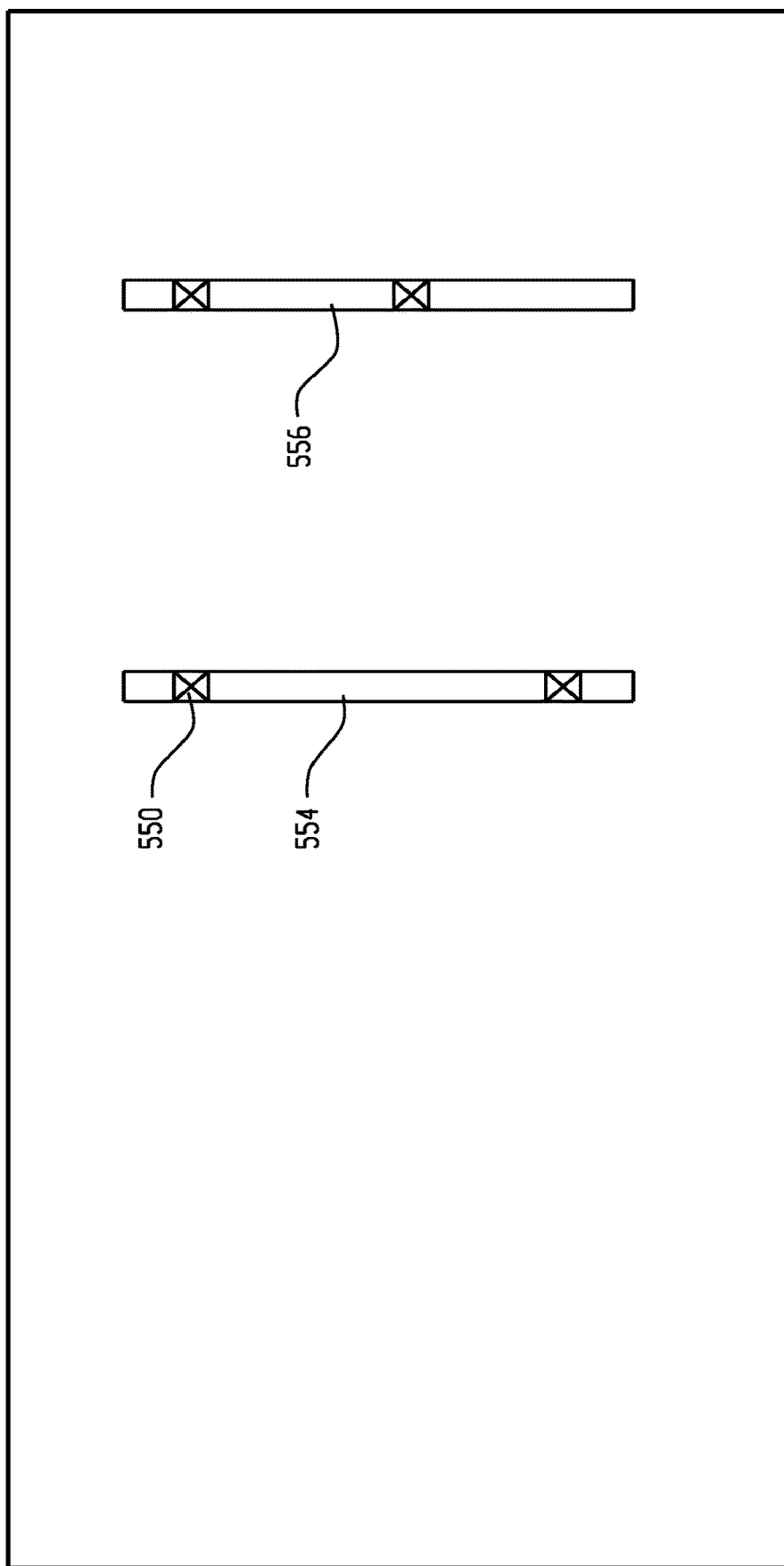
FIG. 8 is a layout diagram illustrating an example layout of the metal-2 and metal-3 layers for a semiconductor structure, in accordance with some embodiments.

FIG. 8 is a layout diagram illustrating an example layout of the metal-2 and metal-3 layers for the semiconductor structure of the circuit of FIG. 3 fabricated in accordance with the method specified in FIG. 5 or 6. The example layout includes VIAL 550, Metal-2 maskA conduction path 554, and Metal-2 maskB conduction path 556. In this example, two Metal-2 conduction paths are fabricated in the metal-2 layer (one Metal-2 mask A and one Metal-2 Mask B path) and no metal-3 conduction paths are fabricated in the metal-3 layer. These example methods resulted in decreased upper metal usage. The example semiconductor device can have more digital blocks, IR drop has been reduced and routing is more flexible.

Figure 9:
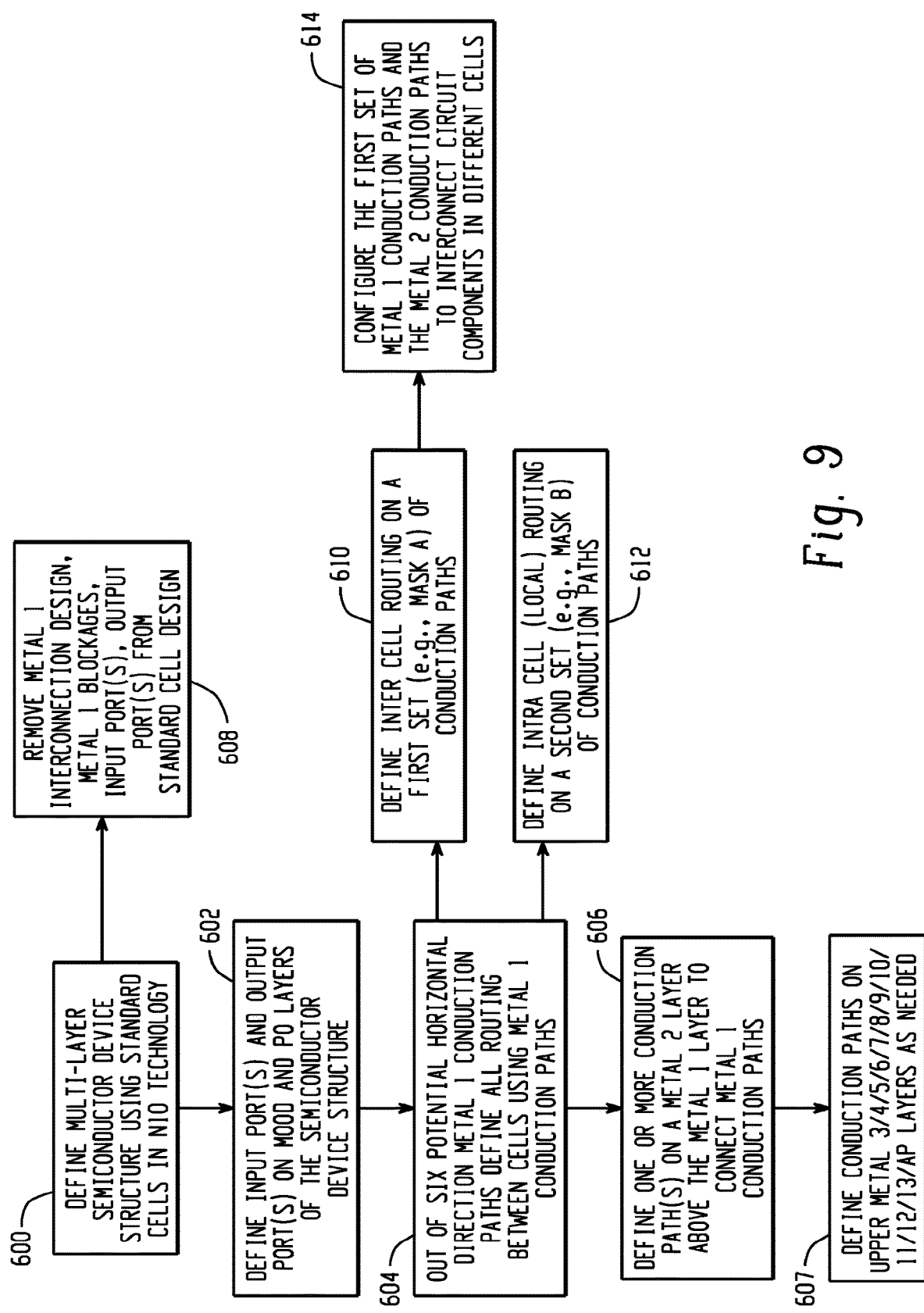
FIG. 9 is a flow chart depicting another example method of fabricating a semiconductor device structure, in accordance with some embodiments.

FIG. 9 is a flow chart depicting another example method of fabricating a semiconductor device structure such as one embodying the circuit depicted in FIG. 3. In this example method, metal-1 usage for inter cell routing is increased and upper level metal usage is decreased. Because of increased metal-1 usage and decreased upper level metal usage, the example semiconductor device can have more digital blocks, IR drop can be reduced and routing can be made more flexible. This example method comprises defining a multi-layer semiconductor device structure comprising a plurality of standard cells arranged on a substrate using N10 fabrication technology having an M0OD layer and a PO layer (operation 600), defining input port(s) and output port(s) on M0OD and/or PO layers of the semiconductor device structure (operation 602), defining a metal-1 layer having up to six horizontal direction metal-1 conduction paths per cell over the M0OD and PO layers, the metal-1 layer having a first set of conduction paths and a second set of conduction paths wherein at least one metal-1 conduction path in the first set of conduction paths extends across multiple cells (operation 604), and defining a metal-2 layer over the metal-1 layer wherein the metal-2 conduction paths are in a direction perpendicular to the direction of the metal-1 conduction paths, the metal-2 layer having a first set of metal-2 conduction paths and a second set of metal-2 conduction paths (operation 606). Interconnection paths may be defined on the upper metal layers (e.g., metal 3/4/5/6/7/8/9/10/11/12/13/AP) as needed (operation 607).

In this example, defining a multi-layer semiconductor device structure comprises removing the metal-1 interconnection design, metal-1 blockages, input port(s), and output port(s) from the standard cell design (operation 608). Also in this example, defining a first set and a second set of interconnection paths on the metal-1 layer comprises defining inter cell routing on the first set of interconnection paths (e.g., MaskA) (operation 610) and defining the intra cell routing on the second set of interconnection paths (e.g., MaskB) (operation 612). The example method also comprises configuring the first set of metal-1 conduction paths, the metal-2 conduction paths, and the upper level metal conduction paths (e.g., metal 3/4/5/6/7/8/9/10/11/12/13/AP to interconnect circuit components in different cells (operation 614).

The methods described herein can be used to fabricate integrated circuits that rely heavily on metal-1 conduction paths for inter cell routing. Thus, use of upper level metal conduction paths can be reduced. This can result in more digital blocks in the integrated circuit, IR drop can be reduced and routing can be made more flexible.

In one embodiment, a method of fabricating an integrated circuit is provided. The method comprises defining a multi-layer semiconductor device structure comprising a plurality of standard cells arranged on a substrate using a fabrication technology having a metal-0 oxide diffusion (M0OD) layer and a polysilicon (PO) layer, defining an input port on either the M0OD or PO layer of the semiconductor device structure and an output port on the M0OD layer of the semiconductor device structure, and defining a metal-1 layer over the M0OD and PO layers, the metal-1 layer having a first set of conduction paths and a second set of conduction paths wherein at least one metal-1 conduction path in the first set of conduction paths extends across multiple cells. The method further comprises defining a metal-2 layer having horizontal direction metal-2 conduction paths over the metal-1 layer wherein the metal-2 conduction paths are in a direction perpendicular to the direction of the metal-1 conduction paths, the metal-2 layer having a first set of metal-2 conduction paths and a second set of metal-2 conduction paths, and configuring the first set of metal-1 conduction paths and the first set of metal-2 conduction paths to interconnect circuit components in different cells, wherein inter cell connections in the semiconductor device structure are made using the first set of metal-1 conduction paths or a combination of the first set of metal-1 and the metal-2 conduction paths.

These aspects and other embodiments may include one or more of the following features. Configuring the first set of metal-1 conduction paths and the first set of metal-2 conduction paths to interconnect circuit components in different cells may comprise defining a via to connect a metal-1 conduction paths to a circuit component. The method may further comprise defining a first via to connect a metal-2 conduction path with a first of the metal-1 conduction paths and a second via to connect the metal-2 conduction path with a second of the metal-1 conduction paths. The first of the metal-1 conduction paths and the second of the metal-1 conduction paths may extend across different cells. The metal-1 layer may have up to six horizontal direction metal-1 conduction paths per cell. Defining an input port on either the M0OD or PO layer of the semiconductor device structure and an output port on the M0OD layer of the semiconductor device structure may comprise defining each input port of the semiconductor device structure and each output port of the semiconductor device structure such that no input port or output port is defined on the metal-1 layer. The integrated circuit may comprise a second semiconductor device structure comprising a plurality of standard cells arranged on a substrate using a fabrication technology having a metal-0 oxide diffusion (M0OD) layer and a polysilicon (PO) layer. The method may be implemented such that no inter cell connection in the semiconductor device structure is made using a metal-3 conduction path in a metal-3 layer above the metal-1 and metal-2 layers. The method may be implemented such that all inter cell connections in the semiconductor device structure are made using the first set of metal-1 conduction paths or a combination of the first set of metal-1 and first set of metal-2 conduction paths. The method may further comprise configuring the second set of metal-1 conduction paths and the second set of metal-2 conduction paths to interconnect circuit components within the same cell. no blockages may be defined in the metal-1 layer. The method may be implemented such that no top level connections are made to the metal-1 layer.

In another embodiment, a multi-layer semiconductor device structure in an integrated circuit (IC) is provided. The multi-layer semiconductor device structure comprises a plurality of cells arranged on a substrate and fabricated using a fabrication technology having a metal-0 oxide diffusion (M0OD) layer and a polysilicon (PO) layer, an input port fabricated on the M0OD or PO layer of a first cell of the plurality of cells, and an output port fabricated on the M0OD layer of a second cell of the plurality of cells. The multi-layer semiconductor device structure further comprises a metal-1 layer over the M0OD and PO layers, the metal-1 layer having a first set of conduction paths and a second set of conduction paths wherein at least one metal-1 conduction path in the first set of conduction paths extends across multiple cells, and a metal-2 layer having horizontal direction metal-2 conduction paths over the metal-1 layer wherein the metal-2 conduction paths are in a direction perpendicular to the direction of the metal-1 conduction paths, the metal-2 layer having a first set of metal-2 conduction paths and a second set of metal-2 conduction paths, wherein the first set of metal-1 conduction paths and the first set of metal-2 conduction paths are configured to interconnect circuit components in different cells, wherein inter cell connections in the semiconductor device structure are made using the first set of metal-1 conduction paths or a combination of the first set of metal-1 and the metal-2 conduction paths.

These aspects and other embodiments may include one or more of the following features. Each input port of the semiconductor device structure may be defined on either the M0OD or PO layer of the semiconductor device structure and each output port of the semiconductor device structure may be defined on the M0OD layer of the semiconductor device structure. The method may be implemented such that no inter cell connection in the semiconductor device structure may be made using a metal-3 conduction path in a metal-3 layer above the metal-1 and metal-2 layers. The method may be implemented such that all inter cell connections in the semiconductor device structure are made using the first set of metal-1 conduction paths or a combination of the first set of metal-1 and first set of metal-2 conduction paths. The second set of metal-1 conduction paths and the second set of metal-2 conduction paths may be configured to interconnect circuit components within the same cell. The metal-1 layer may have up to six horizontal direction metal-1 conduction paths per cell.

In another embodiment, a method for defining interconnections in an integrated circuit comprising a multi-layer semiconductor device structure comprising a plurality of cells arranged on a substrate using standard cells using a fabrication technology having a metal-0 oxide diffusion (M0OD) layer and a polysilicon (PO) layer is provided. The method comprises defining an input port of the semiconductor device structure on either the M0OD or PO layer of the semiconductor device structure and an output port of the semiconductor device structure on the M0OD layer of the semiconductor device structure and defining a metal-1 layer over the M0OD and PO layers, the metal-1 layer having a first set of conduction paths and a second set of conduction paths wherein at least one metal-1 conduction path in the first set of conduction paths extends across multiple cells. The method further comprises defining a metal-2 layer having horizontal direction metal-2 conduction paths above the metal-1 layer wherein the metal-2 conduction paths are in a direction perpendicular to the direction of the metal-1 conduction paths, the metal-2 layer having a first set of metal-2 conduction paths and a second set of metal-2 conduction paths, defining a plurality of upper level metal layers having upper level conduction paths above the metal-2 layers, configuring the first set of metal-1 conduction paths, the metal-2 conduction paths, and the plurality of upper level conduction paths to interconnect circuit components in different cells, wherein inter cell connections are made using the first set of metal-1 conduction paths, the metal-2 conduction paths and the upper level conduction paths, and configuring the second set of metal-1 conduction paths to interconnect circuit components within the same cell.

These aspects and other embodiments may include one or more of the following features. Defining an input port on either the M0OD or PO layer of the semiconductor device structure and an output port on the M0OD layer of the semiconductor device structure may comprise defining each input port of the semiconductor device structure on either the M0OD or PO layer of the semiconductor device structure and each output port of the semiconductor device structure on the M0OD layer of the semiconductor device structure. The method may be implemented such that no intra cell connection in the semiconductor device structure is made using an upper level conduction path. The method may be implemented such that all inter cell connections in the semiconductor device structure are made using the first set of metal-1 conduction paths or a combination of the first set of metal-1 and the metal-2 conduction paths. The method may further comprise configuring the second set of metal-1 conduction paths and the second set of metal-2 conduction paths to interconnect circuit components within the same cell. The metal-1 layer may have up to six horizontal direction metal-1 conduction paths per cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a plurality of cells arranged on a substrate;
an input port fabricated on a metal-0 oxide diffusion (M0OD) or polysilicon (PO) layer of the plurality of cells;
a metal-1 layer over the input port and having a set of metal-1 conduction paths, at least one of which extends across multiple cells of the plurality of cells;
a metal-2 layer above the metal-1 layer; and
a metal-3 layer above the metal-2 layer, wherein no inter cell connection is made using a metal-3 conduction path in the metal-3 layer.

2. The device of claim 1, further comprising an output port defined on the M0OD layer.

3. The device of claim 1, wherein all inter cell connections in the device are made using the set of metal-1 conduction paths or a combination of the set of metal-1 conduction paths and a first set of metal-2 conduction paths.

4. The device of claim 1, wherein a second set of metal-1 conduction paths and a second set of metal-2 conduction paths are configured to interconnect circuit components within the same cell.

5. The device of claim 1, further comprising a set of metal-2 conduction paths, wherein each of the set of metal-1 conduction paths and each of the set of metal-2 conduction paths are associated with a respective rule specifying which type of interconnection path can be made using sets of metal-1 and metal-2 conduction paths.

6. The device of claim 1, further comprising:
a first via connected between a metal-2 conduction path and a first of the metal-1 conduction path; and
a second via connected between the metal-2 conduction path and a second metal-1 conduction path.

7. The device of claim 1, further comprising a third via connected between a metal-1 conduction path and a circuit component.

8. The device of claim 1, wherein the metal-1 layer comprises up to six horizontal direction metal-1 conduction paths per cell over the M0OD layer and the PO layer.

9. The device of claim 1, wherein the input port or an output port is defined on the metal-1 layer.

10. The device of claim 1, wherein the metal-2 layer includes a set of metal-2 conduction paths.

11. A circuit comprising:
a plurality of cells arranged on a substrate;
an output port fabricated on the metal-0 oxide diffusion (M0OD) layer of the plurality of cells;
a metal-1 layer over the output port and having a set of metal-1 conduction paths, at least one of which extends across multiple cells of the plurality of cells;
a metal-2 layer above the metal-1 layer; and
a metal-3 layer above the metal-2 layer, wherein no inter cell connection is made using a metal-3 conduction path in the metal-3 layer.

12. The circuit of claim 11, further comprising an input port defined on the M0OD layer or a polysilicon (PO) layer.

13. The circuit of claim 11, wherein all inter cell connections are made using the metal-1 conduction paths or a combination of the set of metal-1 conduction paths and a first set of metal-2 conduction paths.

14. The circuit of claim 11, wherein a second set of metal-1 conduction paths and a second set of metal-2 conduction paths are configured to interconnect circuit components within the same cell.

15. The circuit of claim 11, further comprising a set of metal-2 conduction paths, wherein each of the set of metal-1 conduction paths and each of the set of metal-2 conduction paths are associated with a respective rule specifying which type of interconnection path can be made using such sets of metal-1 and metal-2 conduction paths.

16. The circuit of claim 11, further comprising:
a first via connected between a metal-2 conduction path and a first metal-1 conduction path; and
a second via connected between the metal-2 conduction path and a second metal-1 conduction path.

17. The circuit of claim 11, wherein a third via is connected between a metal-1 conduction path and a circuit component.

18. The circuit of claim 11, wherein the metal-1 layer comprises up to six horizontal direction metal-1 conduction paths per cell over the M0OD layer and a polysilicon (PO) layer.

19. The device of claim 11, wherein the metal-2 layer includes a set of metal-2 conduction paths.

20. A device comprising:
a plurality of cells arranged on a substrate;
first and second power rails;
a metal-1 layer over a metal-0 oxide diffusion (M0OD) or polysilicon (PO) layer of the plurality of cells and having a set of metal-1 conduction paths, at least one of which extends across multiple cells of the plurality of cells;
a metal-2 layer above the metal-1 layer; and
a metal-3 layer above the metal-2 layer, wherein no inter cell connection is made using a metal-3 conduction path in the metal-3 layer.

* * * * *